(12) United States Patent
Von Thun et al.

(10) Patent No.: US 6,768,339 B2
(45) Date of Patent: Jul. 27, 2004

(54) FIVE VOLT TOLERANT INPUT SCHEME USING A SWITCHED CMOS PASS GATE

(75) Inventors: Matthew S. Von Thun, Colorado Springs, CO (US); Scott C. Savage, Ft. Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 2 days.

(21) Appl. No.: 10/194,650

(22) Filed: Jul. 12, 2002

(65) Prior Publication Data

US 2004/0007712 A1 Jan. 15, 2004

(51) Int. Cl.[7] .......................................... H03K 19/0175
(52) U.S. Cl. ............................ 326/81; 326/21; 326/56; 326/80
(58) Field of Search ............................ 326/21, 56, 80, 326/81, 57, 58, 83

(56) References Cited

U.S. PATENT DOCUMENTS

| | | | | |
|---|---|---|---|---|
| 5,825,206 A | * | 10/1998 | Krishnamurthy et al. | 326/81 |
| 6,181,165 B1 | * | 1/2001 | Hanson et al. | 326/81 |
| 6,310,492 B1 | * | 10/2001 | Ikoma et al. | 326/81 |
| 6,577,163 B1 | * | 6/2003 | Waldrip et al. | 326/81 |

* cited by examiner

*Primary Examiner*—David Nelms
*Assistant Examiner*—Dao H. Nguyen
(74) *Attorney, Agent, or Firm*—Yee & Associates, P.C.

(57) ABSTRACT

An apparatus comprising (i) an input circuit configured to provide a predetermined voltage tolerance in response to a plurality of control signals and (ii) a control circuit configured to generate the plurality of control signals in response to one or more input signals.

10 Claims, 4 Drawing Sheets

FIVE VOLT TOLERANT INPUT SCHEME USING A SWITCHED CMOS PASS GATE

FIELD OF THE INVENTION

The present invention relates to voltage protection circuits generally and, more particularly, to a five volt tolerant input scheme using a switched CMOS pass gate.

BACKGROUND OF THE INVENTION

In a Small Computer Systems Interface (SCSI) bus environment, voltages of 5.5V are sometimes present on the input I/O pads. In order to maintain the reliability of the thick oxide I/O transistors, an input is used to limit the maximum voltage drop across the gate oxide to 3.63V (i.e., the supply voltage VDD). Furthermore, SCSI design specifications specify that a receiver be able to detect a low to high threshold voltage of 1.9V. Therefore, an input signal of 1.9V should pass through to the receiver with no amplitude attenuation.

In conventional designs, a native pass gate with its gate tied to the supply voltage VDD is used to limit the input voltage to VDD while cleanly passing input signals to the receiver with input swings up to VDD. A native NMOS transistor has a significantly smaller threshold voltage (e.g., 0 to 0.2 v) than a typical NMOS transistor (e.g., 0.7V). However, body effect can make threshold voltages even larger (e.g., 0.5V for native and 1.2V for typical NMOS). Hence, a native device can pass signals nearly from (VDD−0.5 v) to VSS.

Native devices are not available in all process technologies. When native devices are not available in a particular process, an alternate solution needs to be implemented. Even if a native device is available for a particular process, the native device can add to the overall cost of a design.

SUMMARY OF THE INVENTION

The present invention concerns an apparatus comprising (i) an input circuit configured to provide a predetermined voltage tolerance in response to a plurality of control signals and (ii) a control circuit configured to generate the plurality of control signals in response to one or more input signals.

The objects, features and advantages of the present invention include providing a voltage protection circuit that may (i) provide a five volt tolerant input, (ii) be implemented using a switched CMOS pass gate, and/or (iii) be implemented in process technologies with no native devices available.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
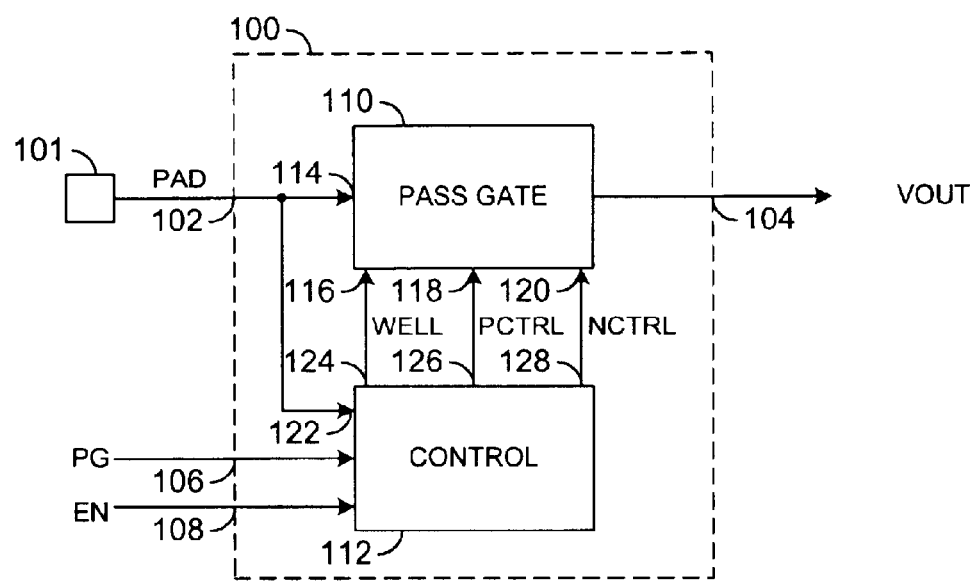
FIG. 1 is a block diagram of a preferred embodiment of the present invention.

Referring to FIG. 1, a block diagram of a circuit 100 is shown in accordance with a preferred embodiment of the present invention. The circuit 100 may be implemented as an input circuit. In one example, the circuit 100 may receive a signal (e.g., PAD) from an I/O pad 101. The I/O pad 101 may connect the circuit 100, in one example, to a Small Computer Systems Interface (SCSI) bus. The circuit 100 may have an input 102 that may receive the signal PAD, an output 104 that may present a signal (e.g., VOUT), an input 106 that may receive a signal (e.g., PG) and an input 108 that may receive a signal (e.g., EN). The circuit 100 may be configured to operate, in one example, with a supply voltage (e.g., VDD) from 2.95V to 3.63V. However, other supply voltage ranges may be implemented to meet design criteria of a particular application. The circuit 100 may be configured to generate the signal VOUT in response to the signals PAD, PG and EN. The signal VOUT may be presented as an input signal to core circuitry (not shown).

The signal PAD may have a voltage level that may be higher than the supply voltage VDD (e.g., 5.5V). The signal EN may be an enable signal. In one example, the circuit 100 may be shut down in response to a first state of the signal EN (e.g., LOW, or a logic "0") and enabled in response to a second state of the signal EN (e.g., HIGH, or a logic "1"). The signal PG may be a control signal. The signal PG may be implemented to prevent the signal PAD from being presented as the signal VOUT. The circuit 100 may be configured to limit the voltage level of the signal VOUT to the supply voltage VDD when the voltage level of the signal PAD exceeds the supply voltage VDD. However, the signal VOUT generally tracks the signal PAD when the voltage level of the signal PAD is within a predetermined range. In general, the circuit 100 may be configured to pass the signal PAD as the signal VOUT with no amplitude attenuation when the voltage level of the signal PAD is within a common mode range of, for example, 0.6 to 1.9 V. However, other voltage ranges may be implemented accordingly to meet the design criteria of a particular application.

The circuit 100 may comprise, in one example, a circuit 110 and a circuit 112. The circuit 110 may be implemented as an input circuit. The circuit 112 may be implemented as a control circuit. The circuit 110 may comprise a pass (or transmission) gate. In one example, the circuit 110 may be implemented as a CMOS pass gate. The circuit 110 may have an input 114 that may receive the signal PAD, an input 116 that may receive a signal (e.g., WELL), an input 118 that may receive a signal (e.g., PCTRL) and an input 120 that may receive a signal (e.g., NCTRL). The signal VOUT may be presented at an output of the circuit 110. The signal WELL may be implemented as a well (or substrate) bias signal. In one example, the signal WELL may be configured to bias the circuit 110 to the one of the signals PAD and VDD having the higher voltage level.

The signals PCTRL and NCTRL may be implemented as control signals. The signals PCTRL and NCTRL are generally configured to control a transmission characteristic (e.g., on resistance) of the circuit 110. The circuit 110 may be configured to generate the signal VOUT in response to the signals PAD, WELL, PCTRL and NCTRL.

The signals PG and EN are generally presented to the circuit 112. The circuit 112 may have an input 122 that may receive the signal PAD, an output 124 that may present the signal WELL, an output 126 that may present the signal PCTRL and an output 128 that may present the signal NCTRL. The circuit 112 is generally configured to generate the signals WELL, PCTRL and NCTRL in response to the signals PAD, VDD, PG and EN. For example, the circuit 112 may be configured to open (or shut off) the pass gate 110 in response to the signal PG to prevent the signal PAD from being presented as the signal VOUT.

Figure 2:
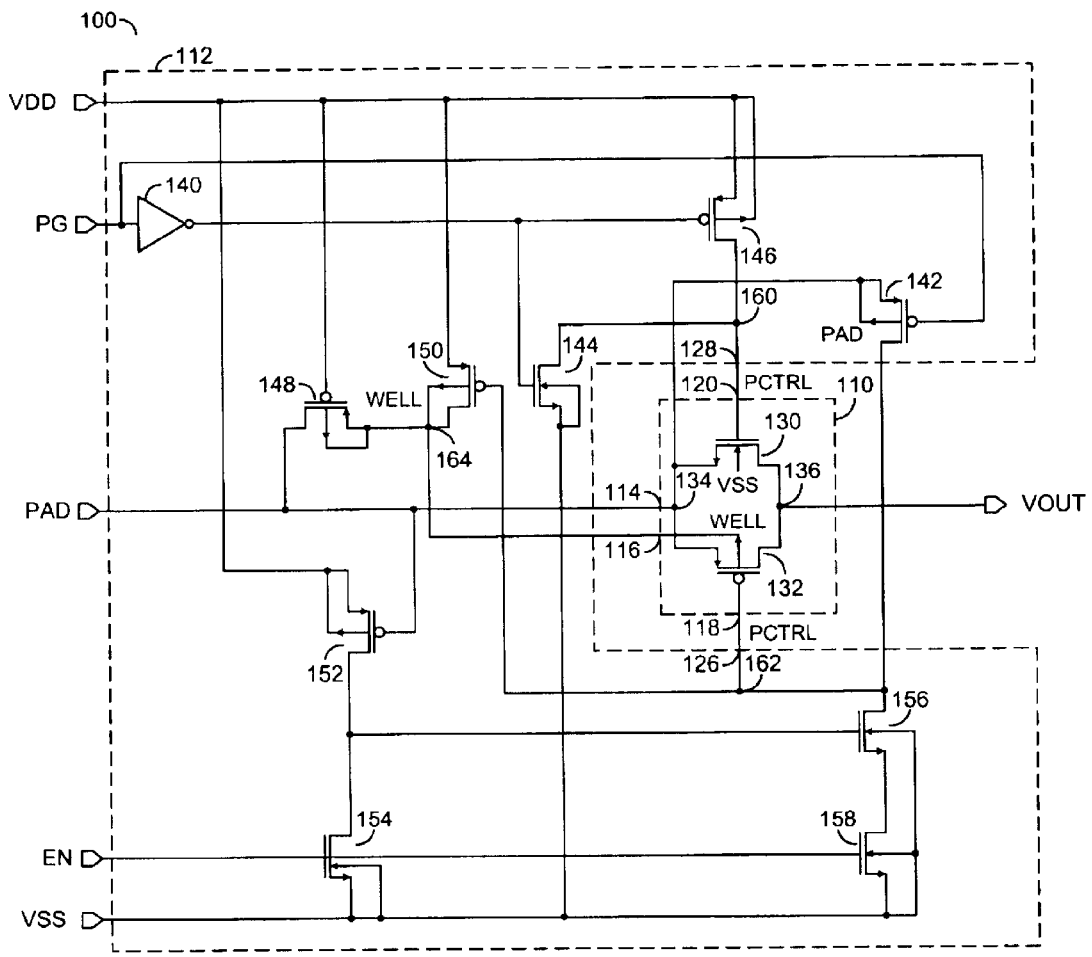
FIG. 2 is a detailed example of a preferred embodiment of the present invention.

Referring to FIG. 2, a more detailed diagram of the circuit 100 is shown in accordance with a preferred embodiment of the present invention. The circuit 110 may comprise a pair of MOS transistors 130 and 132. The transistor 130 may be implemented as a NMOS transistor. The transistor 132 may be implemented as a PMOS transistor. The transistors 130 and 132 are generally configured as a CMOS pass (or transmission) gate. The signal PAD may be presented to a node 134 formed by connection of the sources of the transistors 130 and 132. The signal VOUT may be presented at a node 136 formed by connection of the drains of the transistors 130 and 132. The signal NCTRL is generally presented to a gate of the transistor 130. The signal PCTRL is generally presented to a gate of the transistor 132. A voltage supply return (or ground potential), for example VSS, may be presented to a well (or substrate) terminal of the transistor 130. The signal WELL is generally presented to a well (or substrate) terminal of the transistor 132.

The circuit 112 may comprise, in one example, a gate 140 and a number of transistors 142–158. The gate 140 may be implemented as an inverter. In one example, the gate 140 may be a CMOS inverter. The transistors 142–158 may be implemented as MOS transistors. The transistors 142 and 146–152 may be implemented as one or more PMOS transistors. The transistors 144 and 154–158 may be implemented as one or more NMOS transistors. However, other types and polarity transistors may be implemented to meet the design criteria of a particular application.

The signal PG may be presented to an input of the gate 140 and a gate of the transistor 142. An output of the gate 140 may be connected to a gate of the transistor 144 and a gate of the transistor 146. A drain of the transistor 144 may be connected to a drain of the transistor 146. The signal NCTRL may be presented at a node 160 formed by the connection of the drains of the transistors 144 and 146. A source and a substrate terminal of the transistor 144 may be connected to the supply voltage ground VSS. A source and a substrate terminal of the transistor 146 are generally connected to the supply voltage VDD. The transistors 144 and 146 generally form a CMOS inverter.

A source and a substrate terminal of the transistor 142 generally receive the signal PAD. A drain of the transistor 142 may be connected to a gate of the transistor 150 and a drain of the transistor 156. The signal PCTRL is generally presented at a node 162 formed by the connection of the drain of the transistor 142, the drain of the transistor 156 and the gate of the transistor 150.

A drain of the transistor 148 may receive the signal PAD. A gate of the transistor 148 may receive the supply voltage VDD. A source and a substrate terminal of the transistor 148 may be connected to a drain and a substrate terminal of the transistor 150. The signal WELL may be presented at a node 164 formed by the connection of the drain and substrate terminal of the transistor 150 and the source and substrate terminal of the transistor 148. A source of the transistor 150 may receive the supply voltage VDD. The transistors 148 and 150 generally comprise a bias circuit configured to generate the signal WELL having the higher of the voltage levels of the signals VDD and PAD. The signal WELL is generally presented to the substrate terminal of the transistor 132 to limit a voltage drop across the gate oxide of the transistor 132.

A supply voltage VDD may be presented to a source and a substrate terminal of the transistor 152. The signal PAD may be presented to a gate of the transistor 152. A drain of the transistor 152 may be connected to a drain of the transistor 154 and a gate of the transistor 156. A source and a substrate terminal of the transistor 154 generally receives the supply voltage ground potential VSS. A source of the transistor 156 may be connected to a drain of the transistor 158. A source of the transistor 158 and a substrate terminal of the transistors 156 and 158 are generally connected to the supply voltage ground potential VSS. The signal EN is generally presented to a gate of the transistor 154 and a gate of the transistor 158.

When the voltage level of the signal PAD exceeds the supply voltage minus a predetermined threshold voltage (e.g., VDD-VT), the transistor 142 generally switches ON. The predetermined threshold voltage VT may be implemented, in one example, as a p-channel threshold voltage. When the transistor 142 is switched ON, the signal PAD is presented to the gate of transistor 132 (e.g., as the signal PCTRL) and the transistor 132 generally turns OFF. The transistor 152 is generally configured to switch OFF before the voltage level of the signal PAD reaches a predetermined threshold (e.g., VDD-VT). When the transistor 152 is switched OFF, the gate of the transistor 156 is generally pulled to the power supply ground potential VSS. When the gate of the transistor 156 is pulled to the power supply ground potential VSS, the transistor 156 generally shuts OFF. When the transistor 156 is OFF, leakage from the pad 101 through the circuit 100 to the power supply ground VSS is generally prevented.

Figure 3:
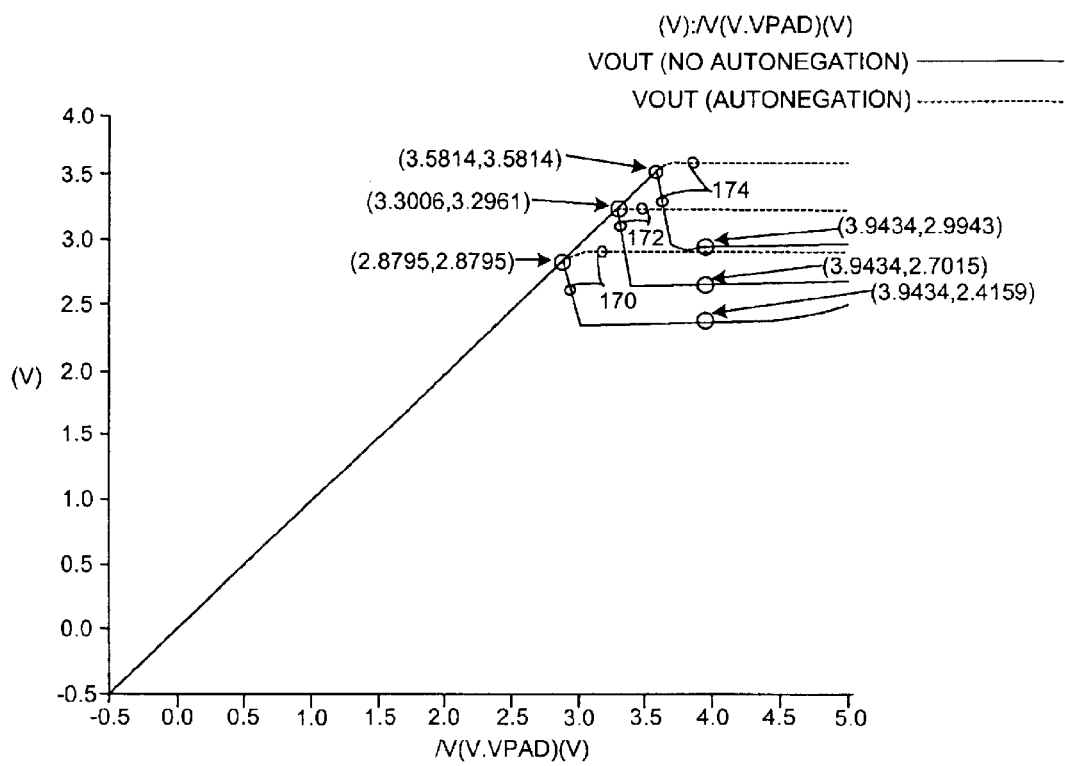
FIG. 3 is a graph of a DC sweep of the circuit of FIG. 1.

Referring to FIG. 3, a graph illustrating example DC sweep simulations of the circuit 100 is shown. A number of traces 170–174 are shown illustrating a voltage level of the signal VOUT that may be generated in response to different voltage levels of the signal PAD and the supply voltage VDD (e.g., VDD=2.95V for trace 170, VDD=3.3 V for trace 172, VDD=3.65V for trace 174). The traces 170, 172 and 174 generally represent the signal VOUT as a function of the signal PAD, where the signal PAD is varied from 0V to 5V. The traces are differentiated by the value of VDD. In general, the signal PAD is actively driven to an asserted state (e.g., HIGH) or a de-asserted state (e.g., LOW). Each of the traces 170, 172 and 174 is illustrated with and without autonegation. In one example, a resistive pullup circuit may be implemented to passively tie the signal PAD to a predefined voltage. As used herein, the term autonegation refers to whether the pullup circuit is included or omitted from the simulation.

A number of sample points are marked (e.g., circled) illustrating example voltage limiting operation of the circuit 100 of FIG. 2. The respective voltage levels of the signals VDD, VPAD and VOUT at the marked example points may be summarized in the following TABLE 1:

TABLE 1

| VDD (V) | VPAD (V) | VOUT (V) |
|---|---|---|
| 2.95 | 2.8795 | 2.8795 |
| 2.95 | 3.9434 | 2.4159 |
| 3.30 | 3.3006 | 3.2961 |
| 3.30 | 3.9434 | 2.7015 |
| 3.65 | 3.5814 | 3.5814 |
| 3.65 | 3.9434 | 2.9943 |

In general, The voltage level of the signal VOUT is less than or equal to the supply voltage VDD even when the voltage level of the signal VPAD exceeds the supply voltage VDD.

Figure 4:
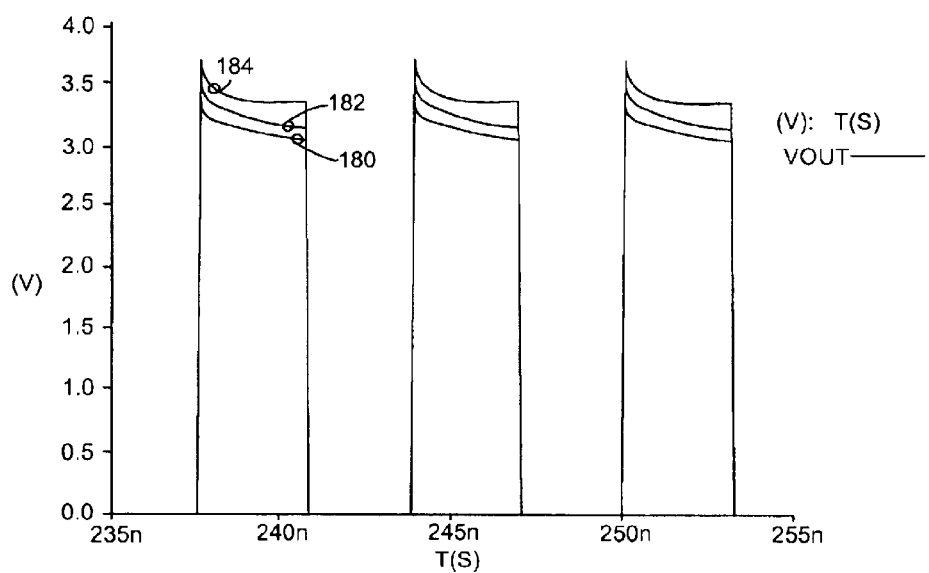
FIG. 4 is a transient simulation of the circuit of FIG. 1.

Referring to FIG. 4, a timing diagram illustrating a transient simulation of the circuit 100 is shown. A number of traces 180–184 are shown illustrating a voltage level of the signal VOUT as a function of the signal PAD at different levels of the supply voltage VDD, where the signal PAD is driven as a 160 MHz square wave signal swinging between 0V and 5V. The traces 180, 182 and 184 are differentiated by the value of VDD (e.g., VDD=2.95V for trace 180, VDD= 3.3V for trace 182, VDD=3.65V for trace 184). The circuit 100 generally provides an adequate input voltage swing (e.g., 0–5V), and maintains the core side voltage (VOUT) at or below a maximum supply voltage of about VDD+10% (e.g., 3.65V).

Figure 5:
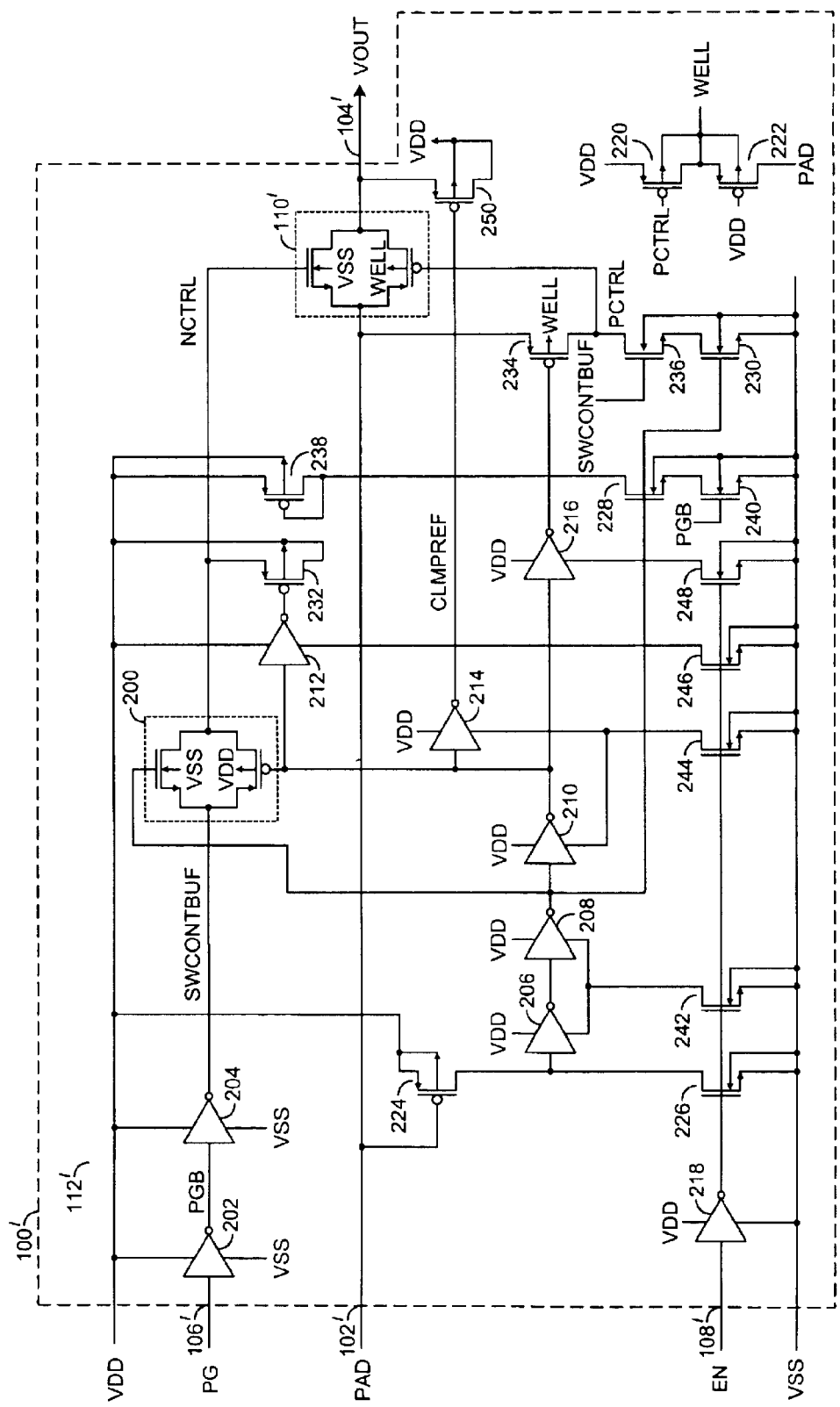
FIG. 5 is a diagram of an alternate embodiment of the present invention.

Referring to FIG. 5, a circuit 100' is shown in accordance with an alternate embodiment of the present invention. The circuit 100' generally comprises a circuit 110' and a circuit 112'. The circuit 110' is generally implemented similarly to the circuit 110 of FIG. 2. The circuit 112' may comprise a circuit 200, a number of gates 202–218 and a number of transistors 220–250. The gates 202–218 may be implemented, in one example, as inverters. The transistors 220, 222, 224, 232, 234, 238 and 250 may be implemented as one or more PMOS transistors. The transistors 226–230, 236, and 240–248 may be implemented as one or more NMOS transistors. However, other types and polarities of transistors may be implemented accordingly to meet the design criteria of a particular application.

The transistors 220 and 222 may comprise a bias circuit similar to the bias circuit comprising the transistors 148 and 150 (described in connection with FIG. 2). A source of the transistor 220 may receive the supply voltage VDD. A gate of the transistor 220 may receive the signal PCTRL. A substrate terminal and a drain of the transistor 220 may be connected to a source of the transistor 222 and a substrate terminal of the transistor 222. The signal WELL may be presented at a node formed by the connection of the drain of the transistor 220, the source of the transistor 222 and the substrate terminals of both transistors 220 and 222. A drain of the transistor 222 may receive the signal PAD. A gate of the transistor 222 may receive the supply voltage VDD.

The signal PG may be presented to an input of the gate 202. An output of the gate 202 may present a signal (e.g., PGB) to an input of the gate 204 and a gate of the transistor 240. An output of the gate 204 may present a signal (e.g., SWCONTBUF) to a first input of the circuit 200 and a gate of the transistor 236. The signal NCTRL may be presented at an output of the circuit 200. The signal PAD may be presented to a gate of the transistor 224. A source and a substrate terminal of the transistor 224 generally receive the supply voltage VDD. A drain of the transistor 224 may be connected to a drain of the transistor 226 and an input of the gate 206. A source and a substrate terminal of the transistor 226 generally receive the voltage supply ground potential VSS.

An output of the gate 206 generally presents a signal to an input of the gate 208. An output of the gate 208 generally presents a signal to a second input of the circuit 200, an input of the gate 210, a gate of the transistor 228 and a gate of the transistor 230. An output of the gate 210 generally presents a signal to a third input of the circuit 200, an input of the gate 212, an input of the gate 214 and an input of the gate 216. In general, the gates 206, 208, 210, 212, 214 and 216 receive the supply voltage VDD and an isolated ground potential VSS.

An output of the gate 212 generally presents a signal to a gate of the transistor 232. A source of the transistor 232 may be connected to the output of the circuit 200. A drain and a substrate terminal of the transistor 232 generally receive the supply voltage VDD. A signal (e.g., CLMPREF) is generally presented at an output of the gate 214.

An output of the gate 216 may be presented to a drain of the transistor 228, a gate of the transistor 234, and a gate and drain of the transistor 238. A source of the transistor 234 may receive the signal PAD. A substrate terminal of the transistor 234 generally receives the signal WELL. A drain of the transistor 234 is generally connected to the drain of a transistor 236. The signal PCTRL is generally presented at a node formed by the connection of the drains of the transistors 234 and 236. A source terminal of the transistor 236 is generally connected to a drain terminal of the transistor 230. A substrate terminal of the transistor 236 and a source and a substrate terminal of the transistor 230 generally receive the signal VSS. A substrate terminal and a source of the transistor 238 generally receive the signal VDD. A source of the transistor 228 generally connects to a drain of the transistor 240. A substrate terminal of the transistor 228 and a source and a substrate terminal of the transistor 240 generally receive the signal VSS.

The signal EN is generally presented to an input of the gate 218. An output of the gate 218 generally presents a signal (e.g., ENB) to a gate of the transistors 226 and 242–248. A source and a substrate terminal of each of the transistors 226 and 242–248 are generally connected to the voltage supply ground potential VSS. A drain of the transistors 242–248 generally connects to respective a voltage supply ground terminal of the gates 206–216.

The signal CLMPREF may be presented to a gate of a transistor 250. The transistor 250 may be implemented, in one example, as a PMOS transistor. A source of the transistor 250 may be connected to the output of the circuit 110. A drain and a substrate terminal of the transistor 250 may receive the supply voltage VDD. The transistor 250 is generally configured to clamp the signal VOUT to the supply voltage VDD in response to the signal CLMPREF.

When the voltage level of the signal PAD exceeds the supply voltage VDD, the transistor 224 generally switches OFF and the transistor 226 generally pulls the input of the gate 206 LOW (e.g., to VSS). The LOW signal at the input of the gate 206 generally propagates through the gates 206–216. The signal generated by the gate 208 generally causes the transistor 230 to turn OFF preventing leakage from the pad 101 to the voltage supply ground VSS. After a time delay (e.g., two gate (or inverter) delays), the transistors 234 and 250 generally turn ON. When the transistor 234 is ON, the signal PAD is presented as the signal PCTRL, thus shutting off the PMOS side of the CMOS pass gate 110'.

When the transistor 250 is switched ON, the signal VOUT is shorted to the supply voltage VDD. Shorting the signal VOUT to VDD generally prevents both capacitive feedthrough (e.g., through the circuit 110') and charge injection (e.g., from the circuit 110') from pushing the voltage level of the signal VOUT to a level greater than the supply voltage VDD. The series of gates 206, 208, 210 and 214 generally ensure that the signal VOUT is not pulled to VDD before the circuit 110' has turned OFF (e.g., the gates generally provide a small delay). The circuit 112' generally provides compliance with the SCSI specification for no DC current being pulled or pushed into the pad 101. A simulation of the circuit 100' generally produces simulation results similar to those shown in FIGS. 3 and 4.

The circuit 200 is generally configured to generate the signal NCTRL in response to the signal SWCONTBUF and the signals received from the gates 208 and 210. The circuit 200 may be implemented, in one example, as a CMOS pass gate. However, other switch circuits may be implemented accordingly to meet the design criteria of a particular application. An n-channel portion of the circuit 200 may be driven by the output of the gate 208. A p-channel portion of the 200 may be driven by the output of the gate 210. When the voltage level of the signal PAD is less than VDD−|p-channel threshold voltage|, the circuit 200 generally conducts allowing the signal SWCONTBUF to drive the signal NCTRL to the level of the signal SWCONTBUF. In general, the signal SWCONTBUF drives the signal NCTRL (i) to VDD to turn on the circuit 110' and (ii) to VSS to turn off the circuit 110'.

When the signal PAD has a voltage level greater than VDD−|p-channel threshold voltage|, the signal PG is generally disregarded and the circuit 200 generally shuts off as the transistor 224 turns off in response to the high voltage of the signal PAD. When the circuit 200 is shut off, the signal NCTRL is generally driven to VDD in response to the output of the gate 212. Driving the signal NCTRL to VDD generally protects the n-channel portion of the circuit 110' from having a voltage across the source and drain terminals greater than the maximum supply voltage (e.g., 3.65V). In general, the n-channel portion of the circuit 110' does not switch on when the signal NCTRL is driven to VDD, the signal PAD has a high voltage level, and the signal VOUT is clamped to VDD (e.g., by the transistor 250).

The present invention generally provides a five volt tolerant input circuit. The present invention generally senses conditions where the input voltage exceeds a predetermined maximum supply voltage and then switches off the PMOS side of a CMOS pass gate in order to hold the voltage seen by internal core circuitry at or below the predetermined maximum allowable supply voltage. The present invention may be implemented without using a costly native device that may not be a process option. The present invention may provide a method and/or architecture for implementing voltage tolerant input circuits in process technologies with no native devices.

As used herein, a five volt tolerant circuit is a circuit that is able to withstand a high voltage (e.g., five volts) on an input without compromising reliability (e.g., stressing transistors with high voltages) while power is being supplied. A CMOS pass gate generally comprises an n-channel transistor in parallel with a p-channel transistor. The two transistors generally pass signals over the entire common mode range of the voltage supply (e.g., from VDD to VSS). An NMOS pass gate generally comprises an n-channel transistor used solely to pass a signal. The NMOS transistor generally passes common mode signals from VDD−|n-channel threshold voltage| to VSS. Hence, an NMOS pass gate can generally pass signals from (VDD−1.2 v) to VSS. A PMOS pass gate generally comprises a p-channel transistor used solely to pass a signal. The PMOS pass transistor generally passes common mode signals from VDD to VSS+|p-channel threshold voltage|. Hence, the PMOS pass gate can generally pass signals from VDD to (VSS+1.2 v). A native NMOS pass gate generally provides an extended range of common mode swing due to smaller input threshold characteristics.

The present invention generally comprises a method and/or architecture for providing five-volt tolerant protection by sensing when an input voltage exceeds the supply voltage. The sensing circuitry then turns off the p-channel portion of a CMOS pass gate when the input voltage is greater than the supply voltage. The n-channel portion of the CMOS pass gate generally turns off similarly to a NMOS pass gate in response to a high common mode voltage. Since both the p-channel and n-channel portions of the CMOS pass gate are turned off and no longer pass signal, the internal core circuitry is generally exposed to voltages of VDD or less.

In order to extend the input range of the conventional voltage tolerant input circuit, and provide a lower resistance at high input voltages, the present invention generally employs a CMOS pass gate in place of the conventional NMOS pass gate. However, to satisfy 5V tolerant requirements, the present invention generally turns off the p-channel device in the CMOS pass gate when the pad voltage is equal to, or greater than the supply voltage VDD. A second PMOS device is generally configured to sense when the pad voltage reaches VDD. Once the pad voltage reaches VDD, the gate of the p-channel device in the CMOS pass gate is connected to the pad, turning off the p-channel device. In a preferred embodiment of the present invention, a control signal is generated when the pad voltage is near the supply voltage VDD. The control signal is generally configured to ultimately turn off the CMOS pass gate entirely.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
  an input circuit configured to provide a predetermined voltage tolerance in response to a plurality of control signals, wherein the input circuit includes a CMOS pass gate that includes an n-channel device and a p-channel device; and
  a control circuit configured to generate said plurality of control signals in response to one or more input signals, wherein the plurality of control signals includes a first control signal that controls a transmission characteristic of the n-channel device and a second control signal that controls a transmission characteristic of the p-channel device.

2. The apparatus according to claim 1, wherein said apparatus comprises a small computer system interface (SCSI) device.

3. The apparatus according to claim 1, wherein a voltage drop across a gate oxide of said p-channel device is limited in response to a third one of said plurality of control signals.

4. The apparatus according to claim 1, wherein said plurality of control signals comprises a well bias signal.

5. The apparatus according to claim 4, wherein said control circuit is configured to generate said bias signal in response to said input signal and a supply voltage.

6. The apparatus according to claim 5, wherein said bias signal has a voltage level that is the higher of a voltage level of said input signal and said supply voltage.

7. The apparatus according to claim 1, wherein said control circuit is configured to limit a leakage current from an I/O pad to a voltage supply ground when said input signal has a voltage level within a predetermined threshold voltage of a supply voltage.

8. The apparatus according to claim 1, wherein said control circuit is configured to clamp an output of said input circuit to a supply voltage when said input signal has a voltage level greater than said supply voltage.

9. The apparatus according to claim 1, wherein:
  said p-channel device is switched off in response to a voltage level of said input signal exceeding a supply voltage; and
  said n-channel device is switched off in response to said voltage level of said input signal exceeding a predetermined common mode voltage level.

10. An apparatus comprising:
  an input circuit configured to provide a predetermined voltage tolerance in response to a plurality of control signals; and a control circuit configured to generate said plurality of control signals in response to one or more input signals, wherein:

said input circuit comprises a CMOS pass gate (i) having a p-channel portion and an n-channel portion and (ii) comprising a first terminal configured to receive said input signal, a second terminal configured to present an output signal, a third terminal configured to receive a first control signal, a fourth terminal configured to receive a second control signal, a fifth terminal configured to receive a bias signal and a sixth terminal configured to receive a voltage supply ground potential; and said control circuit comprises (i) a bias circuit configured to generate said bias signal having a voltage level determined by the higher of a voltage level of said input signal and a supply voltage, (ii) a p-channel device configured to generate said first control signal in response to said input signal and a second input signal, (iii) a circuit configured to generate said control signal in response to said second input signal and (iv) a circuit configured to prevent leakage from said input signal to a voltage supply ground when said voltage level of said input signal is greater than said supply voltage.

* * * * *